United States Patent
Wang et al.

(10) Patent No.: US 8,988,382 B2
(45) Date of Patent: Mar. 24, 2015

(54) FLAT SURFACE TOUCH DEVICE FOR INTRODUCING VISUAL EFFECT

(71) Applicants: Wistron Corporation, New Taipei (TW); eTurboTouch Technology Inc., Taoyuan County (TW)

(72) Inventors: Kuei-Ching Wang, Taoyuan County (TW); Yu-Heng Hsieh, Taipei (TW); Ta-Hu Lin, Taipei (TW); Tung-Hsin Liu, Taichung (TW)

(73) Assignees: Wistron Corporation, Hsichih, New Taipei (TW); eTurboTouch Technology Inc., Zhongli Dist., Taoyuan (TW)

( * ) Notice: Subject to any disclaimer, the term of this patent is extended or adjusted under 35 U.S.C. 154(b) by 0 days.

(21) Appl. No.: 14/447,628

(22) Filed: Jul. 31, 2014

(65) Prior Publication Data

US 2014/0339067 A1 Nov. 20, 2014

Related U.S. Application Data

(62) Division of application No. 13/212,202, filed on Aug. 18, 2011, now Pat. No. 8,928,605.

(30) Foreign Application Priority Data

May 12, 2011 (TW) .............................. 100116725 A (51) Int. Cl.
*G06F 3/041* (2006.01)
*H03K 17/96* (2006.01)

(52) U.S. Cl.
CPC ............ *G06F 3/0412* (2013.01); *H03K 17/962* (2013.01)
USPC ........................................................ 345/173

(58) Field of Classification Search
CPC .......... G06F 3/044–3/045; G06F 2203/04112; G06F 2203/04113; G06F 2203/04103
USPC ..................... 345/156–184; 178/18.01–20.04
See application file for complete search history.

(56) References Cited

U.S. PATENT DOCUMENTS

| 5,867,151 A | * | 2/1999 | Nakai ............................ 345/173 |
| 5,987,502 A | * | 11/1999 | Banks et al. ................... 709/203 |
| 6,333,754 B1 | * | 12/2001 | Oba et al. ....................... 347/112 |
| 6,741,385 B2 | * | 5/2004 | Ikeda et al. .................... 359/296 |
| 6,987,502 B1 | * | 1/2006 | Kishi et al. ..................... 345/107 |
| 8,487,904 B2 | * | 7/2013 | Mi ................................. 345/174 |
| 2005/0202238 A1 | | 9/2005 | Kishioka |
| 2009/0085885 A1 | * | 4/2009 | Wu et al. ........................ 345/173 |
| 2009/0102808 A1 | * | 4/2009 | Huang et al. ................... 345/173 |
| 2009/0211891 A1 | * | 8/2009 | Lai et al. ........................ 200/512 |
| 2009/0236151 A1 | * | 9/2009 | Yeh et al. .................... 178/18.03 |
| 2009/0315854 A1 | * | 12/2009 | Matsuo .......................... 345/174 |
| 2010/0045625 A1 | * | 2/2010 | Yang et al. ..................... 345/173 |
| 2010/0164881 A1 | * | 7/2010 | Kuo et al. ...................... 345/173 |

(Continued)

FOREIGN PATENT DOCUMENTS

JP         4515118 B2    7/2010
KR   2020110002223 U    3/2011

*Primary Examiner* — Patrick F Marinelli
(74) *Attorney, Agent, or Firm* — Winston Hsu; Scott Margo (57) ABSTRACT

An electrode and an isolation layer of a touch device are the same color, so that a user of the touch device perceives a good visual effect without having to employ expensive optical adhesive and decorative films in the touch device. The front bezel design used in conventional touch devices can thus be abandoned. Further, simpler fabrication, higher yield rate, and lower cost are also achieved.

17 Claims, 7 Drawing Sheets

(56) References Cited

U.S. PATENT DOCUMENTS

| | | |
|---|---|---|
| 2011/0050621 A1 | 3/2011 | Hsu |
| 2011/0090159 A1* | 4/2011 | Kurashima ............... 345/173 |
| 2011/0157061 A1* | 6/2011 | Kao et al. ............... 345/173 |
| 2011/0169751 A1* | 7/2011 | Kim et al. ............... 345/173 |
| 2011/0227842 A1* | 9/2011 | Lin et al. ............... 345/173 |
| 2011/0227847 A1* | 9/2011 | Yoshiyama ............... 345/173 |
| 2011/0227867 A1* | 9/2011 | Ogawa et al. ............... 345/174 |
| 2012/0075207 A1* | 3/2012 | Jang ............... 345/173 |
| 2013/0106746 A1* | 5/2013 | Lai et al. ............... 345/173 |
| 2013/0135233 A1* | 5/2013 | Wang et al. ............... 345/173 |

* cited by examiner

FLAT SURFACE TOUCH DEVICE FOR INTRODUCING VISUAL EFFECT

CROSS REFERENCE TO RELATED APPLICATIONS

This application is a division of U.S. patent application Ser. No. 13/212,202, filed Aug. 18, 2011, which claims priority to Taiwan Patent Application No. 100116725, filed May 12, 2011, and included herein by reference in its entirety.

BACKGROUND OF THE INVENTION

1. Field of the Invention

The present invention relates to a flat surface touch device, and more particularly, to a flat surface touch device introducing good visual effects through an isolation layer and an electrode of the flat surface touch device having a same color to shield another electrode on a base plate of the flat surface touch device without using optical adhesives and decoration plates.

2. Description of the Prior Art

Conventional touch devices include resistive, capacitive, infrared, and sound-wave touch panels, where the resistive touch panel includes four-wire, five-wire, and six-wire touch panels. Conventionally, a full-planar visual effect can be achieved on a touch panel without using a front bezel by using highly-transparent optical adhesives to bind a decoration plate to the touch panel, where the decoration plate is utilized for shielding edges of the touch panel.

Figure 1:
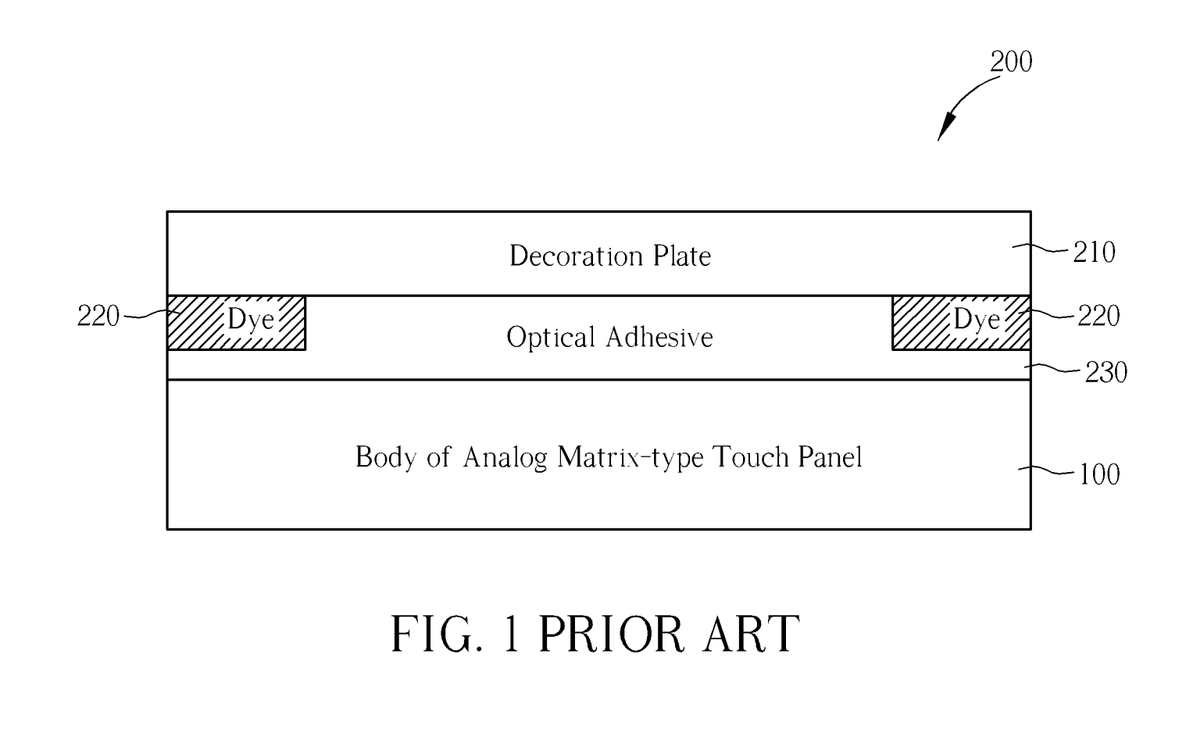
FIG. 1 schematically illustrates a lateral view of a conventional analog matrix-type touch device.

Please refer to FIG. 1, which schematically illustrates a lateral view of a conventional analog matrix-type touch device 200 which may be utilized for four-wire/five-wire/six-wire/capacitive touch devices. As shown in FIG. 1, the analog matrix-type touch device 200 includes a decoration plate 210, a dye 220, a high-transparency optical adhesive 230, and a body 100. The decoration plate 210, the dye 220, and the optical adhesive 230 are utilized for achieving the full-planar visual effect.

Figure 2:
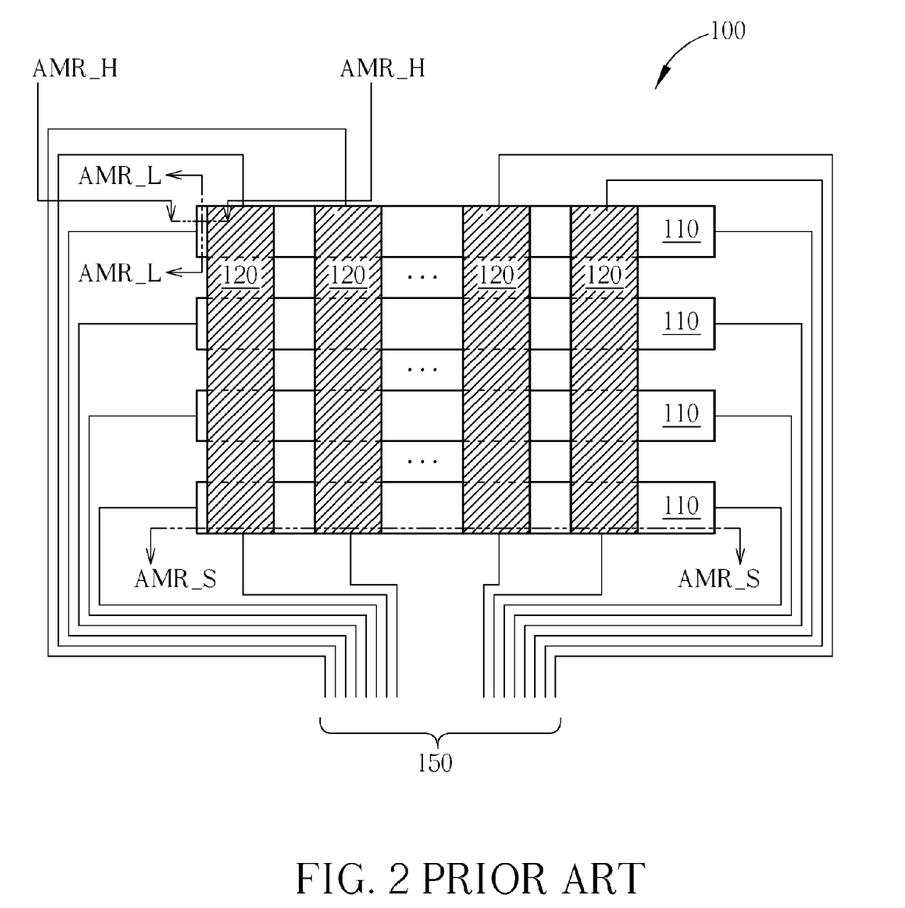
FIG. 2 schematically illustrates a vertical and transparent view of the body shown in FIG. 1.
Figure 3:
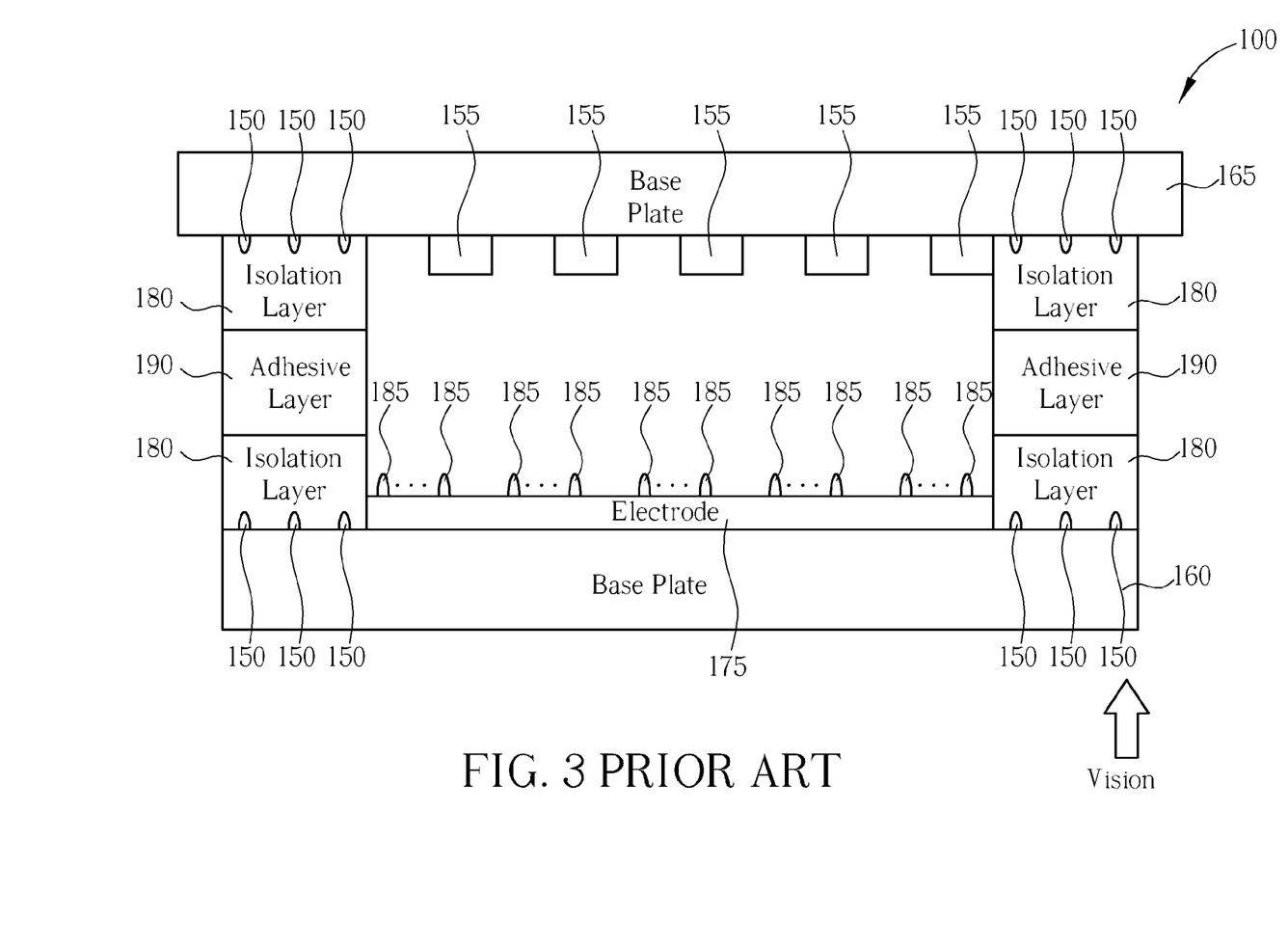
FIG. 3 illustrates a lateral and transparent view of the body shown in FIG. 2.

Please refer to FIGS. 2-3. FIG. 2 schematically illustrates a vertical and transparent view of the body 100 shown in FIG. 1. FIG. 3 illustrates a lateral and transparent view of the body 100 shown in FIG. 2.

As shown in FIG. 2, at least a plurality of electrodes 110 are aligned in horizontal bars and a plurality of electrodes 120 are aligned in vertical bars on the body 100. The plurality of electrodes 110 is orthogonal to the plurality of electrodes 120 in alignment. Moreover, a plurality of conductive wires 150 is disposed on a lateral side of the body 100 corresponding to the plurality of electrodes 110 and 120, and is electrically coupled to the plurality of electrodes 110 and 120 for transmitting sense signals of the analog matrix-type touch device 200.

FIG. 3 shows the lateral side of the body 100 along a section line AMR_S shown in FIG. 2. As shown in FIG. 3, the body 100 further includes base plates 160 and 165, a plurality of separated electrodes 155, a plurality of conductive wires 150 regarded as a plurality of second electrodes, an electrode 175, a plurality of dot spacers 185, and an adhesive layer 190. The plurality of electrodes 155 and 175, which are regarded as first electrodes, are utilized for generating a uniform electrical field on the analog matrix-type touch device 200. The conductive wires 150 are utilized for transmitting signals. Therefore, higher conductivity is required by the conductive wires 150 than the plurality of electrodes 155 and 175.

Conventionally, the base plate 160 is transparent, so that as shown in FIG. 2, the conductive wires 150 and the isolation layer 180 are visible to a user of the analog matrix-type touch device 200. Therefore, the full-planar visual effect cannot be fulfilled, since the user sees the conductive wires 150 at the edges of the analog matrix-type touch device 100.

SUMMARY OF THE INVENTION

For overcoming the defect that the full-planar visual effect cannot be fulfilled on a conventional touch device, the present invention discloses a full-planar touch device as an improvement.

The claimed invention discloses a flat surface touch device which comprises a first base plate, a transparent conductive film, a first electrode, a first isolation layer, a second electrode, a second isolation layer, an adhesive layer and a second base plate. The first base plate is a transparent base plate. The transparent conductive film is formed on a first side of the first base plate. The first electrode is formed on a first side of the transparent conductive film and electrically coupled to the transparent conductive film. The first isolation layer is formed on the first side of the transparent conductive film and a first side of the first electrode. The second electrode is formed on the first side of the first electrode. A color of the second electrode is different from a color of the first electrode. The second isolation layer is formed on a first side of the second electrode. A color of the first isolation layer is the same with the color of the first electrode. The adhesive layer disposed on a first side of the second isolation layer. The second base plate is formed on a first side of the adhesive layer.

The claimed invention also discloses a flat surface touch device which comprises a first base plate, a transparent conductive film, a first isolation layer, a first electrode, a second electrode, a second isolation layer, an adhesive layer and a second base plate. The first base plate is a transparent base plate. The transparent conductive film is formed on a first side of the first base plate. The first isolation layer is formed on the first side of the first base plate and the first side of the transparent conductive layer. The first electrode is formed on the first side of the transparent conductive film and electrically coupled to the transparent conductive film. The second electrode is formed on a first side of the first electrode. A color of the second electrode is different from a color of the first electrode. The second isolation layer is formed on a first side of the second electrode. A color of the first isolation layer is the same with the color of the first electrode. The adhesive layer is disposed on a first side of the second isolation layer. The second base plate is disposed on a first side of the adhesive layer.

These and other objectives of the present invention will no doubt become obvious to those of ordinary skill in the art after reading the following detailed description of the preferred embodiment that is illustrated in the various figures and drawings.

DETAILED DESCRIPTION

The purpose of the present invention is to achieve the full-planar visual effect without using highly-transparent optical adhesives or front bezels, by directly utilizing a conductive film having a same color as an edge frame of a touch device, so that the conductive film and the edge frame are uniform in appearance. In the following embodiments of the present invention, internal structure of the body 100 is adapted, and the adaption of the body 100 will be introduced with the aid of lateral views along the section lines AMR_S or AMR_L shown in FIG. 2.

Figure 4:
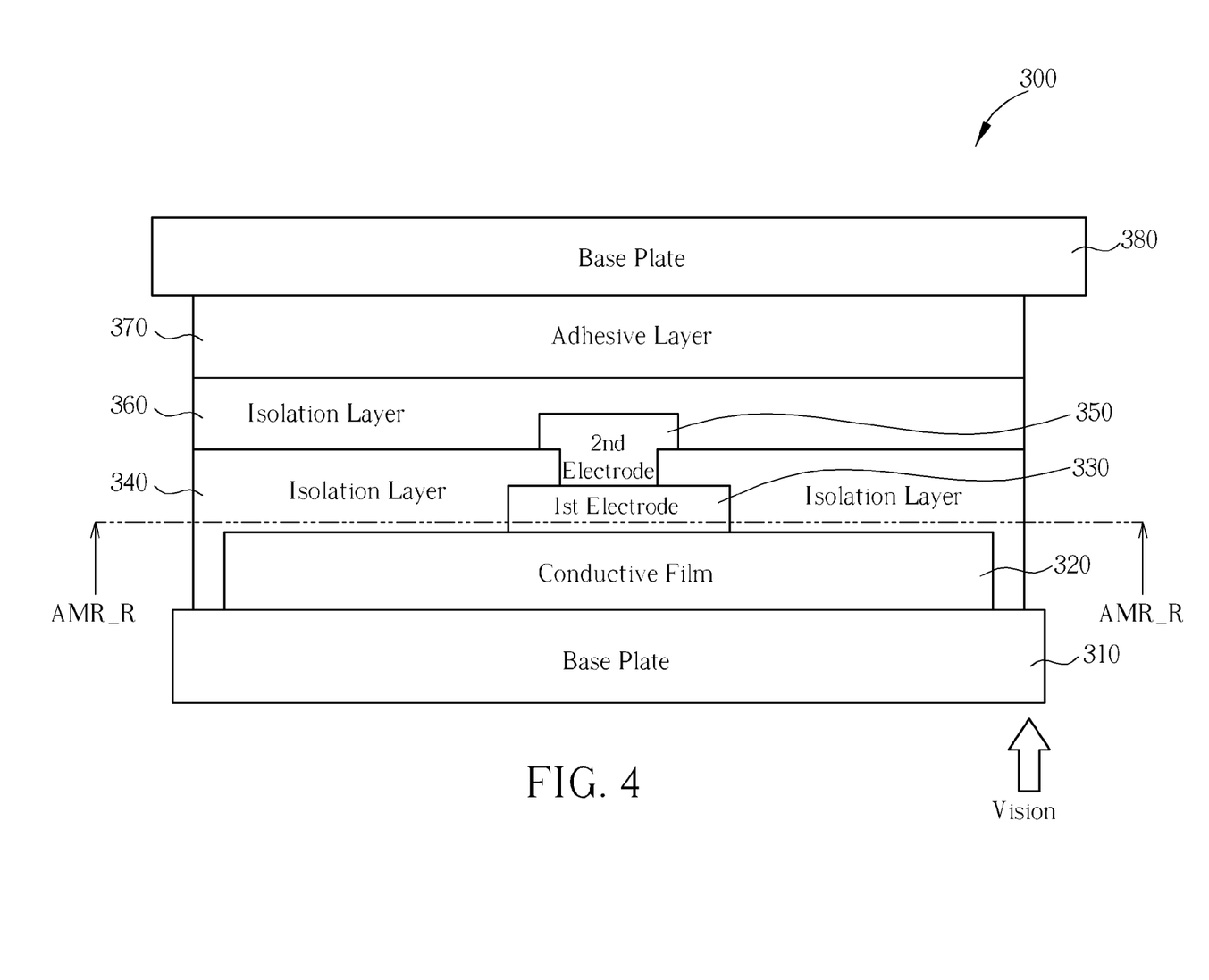
FIGS. 4-6 illustrate touch devices according to embodiments of the present invention.

Please refer to FIG. 4, which illustrates a side view of a touch device 300 according to a first embodiment of the present invention, where the side view is shown along the section line AMR_L shown in FIG. 1 for introducing an inner structure of the touch device 300. As shown in FIG. 4, the touch device 300 includes base plates 310 and 380, a conductive film 320, a first electrode 330, a plurality of isolation layers 340 and 360, a second electrode 350, and an adhesive layer 370. The second electrode 350 may have a same effect and material as the conductive wires 150 shown in FIG. 2, and may also be implemented with metal conductive wires made of silver, copper, molybdenum, aluminum, and/or an alloy. A color of the first electrode 330 is different from a color of the second electrode 350. The base plate 310 is a transparent plate. The conductive film 320 is a transparent film. Therefore, both the base plate 310 and the conductive film 320 are transparent to the user.

In an embodiment of the present invention, materials of the base plate 310 may include glass, Polyethylene terephthalate (PET), Acrylic, Polymethylmethacrylate (PMMA), or Polycarbonate. Materials of the conductive film 320 may include metal oxides, such as Indium tin oxide (ITO), Indium zinc oxide (IZO), and Aluminum or zinc oxide (AZO), and may also include transparent conductive polymer film or transparent metal film.

As can be seen from FIG. 4, the touch device 300 includes a transparent base plate 310, a conductive film 320, a first electrode 330, an isolation layer 340, a second electrode 350, an isolation layer 360, an adhesive layer 370, and a base plate 380 from bottom to top, where a color of the first electrode 330 is the same as a color of the isolation layer 340. As can be seen from FIG. 4, the conductive film 320 is formed on a top side of the base plate 310; the first electrode 330 is formed on a top side of the conductive film 320 and is electrically coupled to the conductive film 320; the isolation layer 340 is formed on a top side of the conductive layer 320 and a top side of the first electrode 330; the second electrode 350 is formed on a top side of the isolation layer 340 and the top side of the first electrode 330; and the isolation layer 360 is formed on the top side of the isolation layer 340 and a top side of the second electrode 350. However, the top side of any element is described with respect to the touch device 300. If the touch device 300 shown in FIG. 4 is reversed, then the top side of the above-mentioned elements is changed to be a bottom side according to another embodiment of the present invention. For uniformity, the top side of the above-mentioned elements is regarded as a first side, and the bottom side of the above-mentioned elements is regarded as a second side throughout the description, and vice versa.

As can be seen from FIG. 4, when line of sight of an observer passes through the transparent base plate 310 and the conductive film 320, only the first electrode 330 and the isolation layer 340 having the same color will be visible, whereas the second electrode 350 is invisible.

Figure 5:
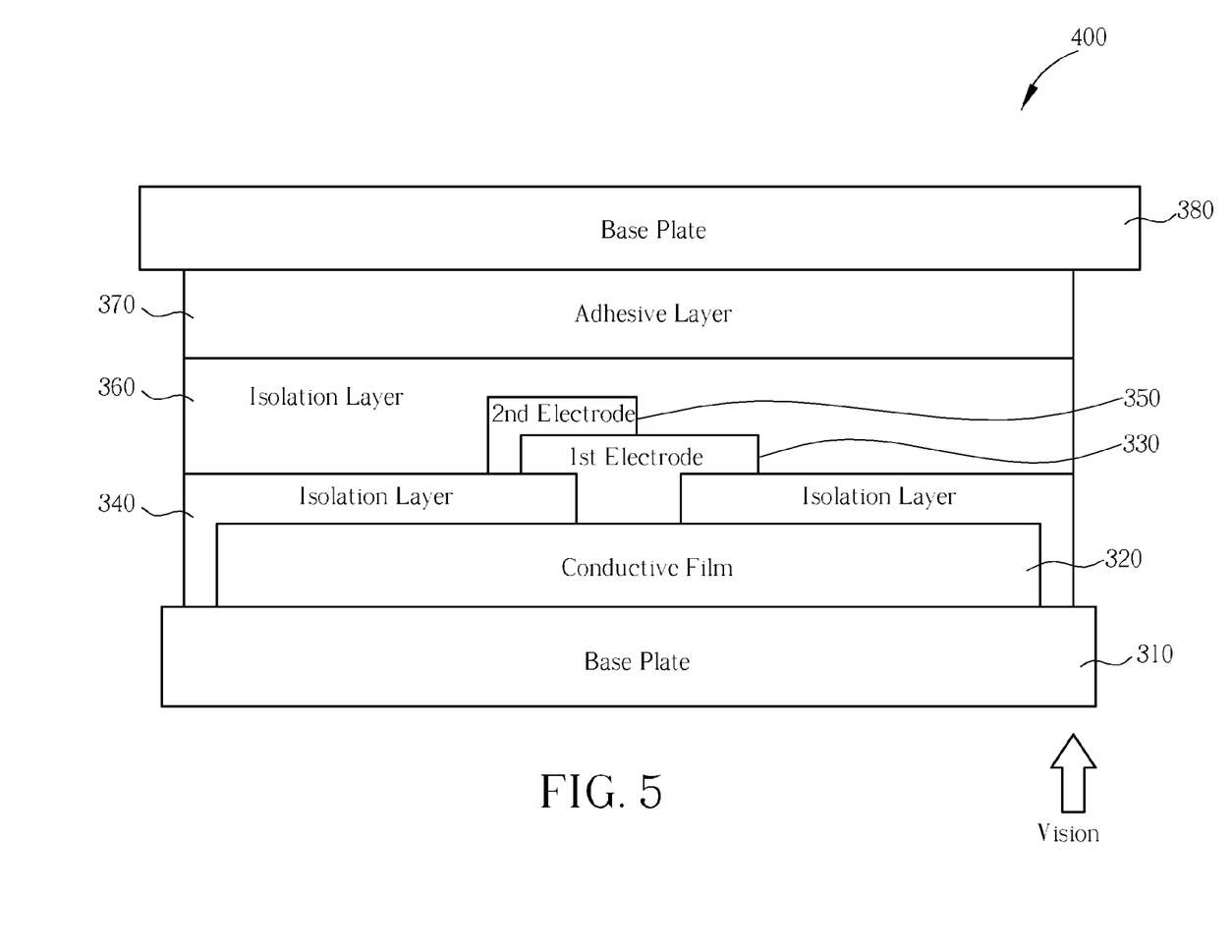

Please refer to FIG. 5, which illustrates a lateral and transparent view of a touch device 400 according to a second embodiment of the present invention, where the lateral and transparent view is shown along the section line AMR_L shown in FIG. 2, so as to illustrate the inner structure of the touch device 400 in detail. Difference between the touch devices 300 and 400 lies in a reversed order of printing the first electrode 330 and the isolation layer 340; in other words, on the first side (i.e., the top side) of the conductive film 320, the touch device 400 at least includes the isolation layer 340, the first electrode 330, the second electrode 350, the isolation layer 360, the adhesive layer 370 and the base plate 380 in that order. Note that the first electrode 330 is also electrically coupled to the second electrode 350.

As can be seen from FIG. 5, since the first electrode 330 and the isolation layer 340 have the same color, the observer also observes the same color of both the first electrode 330 and the isolation layer 340, and the second electrode 350 is invisible to the observer as well.

In the embodiments shown in FIGS. 4-5, materials of the isolation layer 340 may be the same as or different from materials of the isolation layer 360 if necessary, i.e., colors of the materials of the isolation layers 340 and 360 may be the same or different. In certain embodiments of the present invention, the second electrode 350 may extend through the isolation layer 360, or the second electrode 350 may also be partially disposed on the top side of the isolation layer 360, i.e., the second electrode 350 is not limited to being disposed on a bottom side of the isolation layer 360 as shown in FIGS. 4-5.

Figure 6:
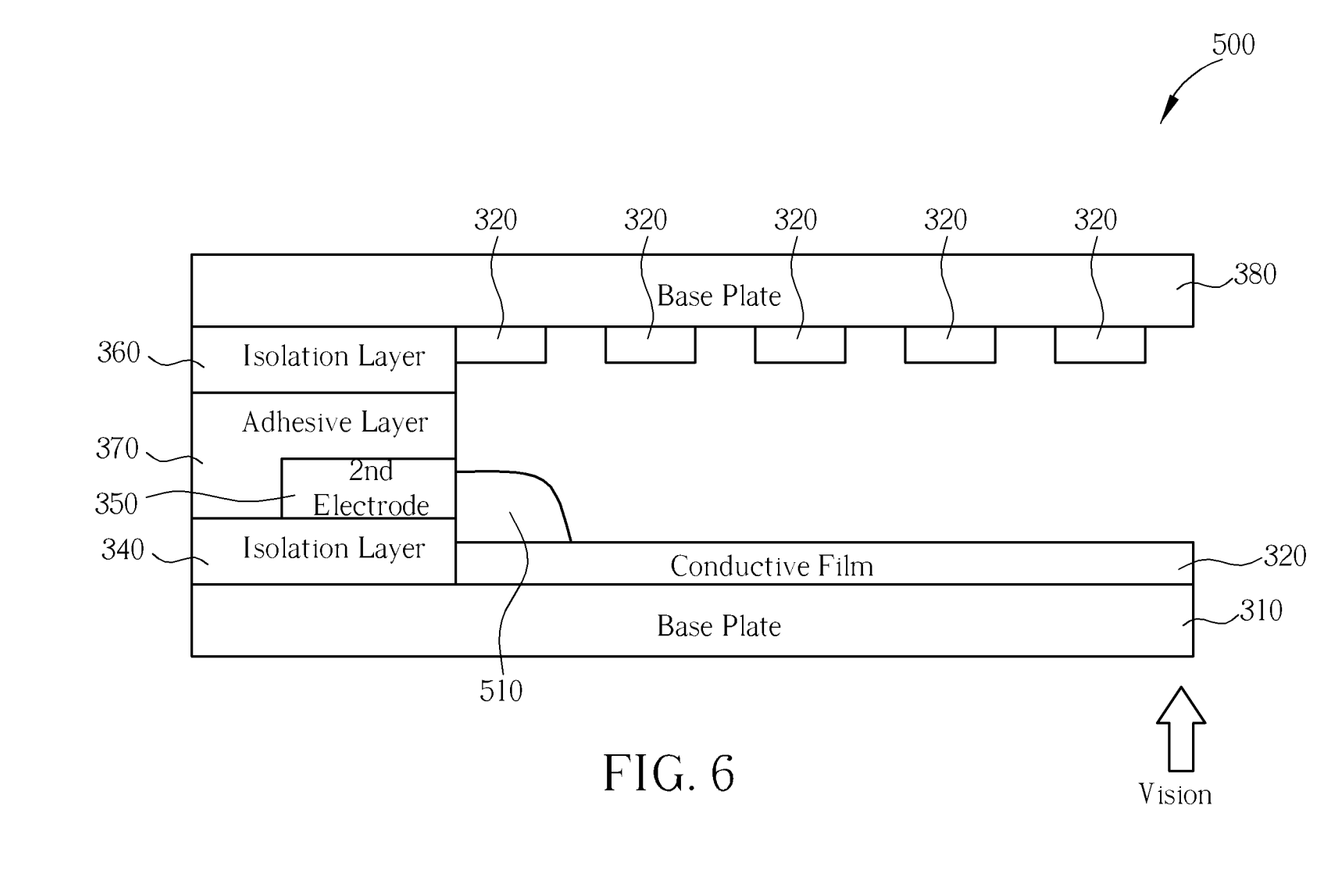

Please refer to FIG. 6, which illustrates a lateral and transparent view of a touch device 500 according to a third embodiment of the present invention, where the lateral and transparent view is formed corresponding to the section line AMR_H shown in FIG. 2 for illustrating the inner structure of the touch device 500 in detail. On the first side of the conductive film 320, the touch device 500 at least includes the isolation layer 340, the second electrode 350, a transparent conductive layer 510, the isolation layer 360, the adhesive layer 370, and the base plate 380 in that order. The transparent conductive layer 510 is electrically coupled to the second electrode 350.

As can be seen from FIG. 6, since both the base plate 310 and the conductive film 320 are transparent to the vision of the observer, only the color of the isolation film 340 will be observed by the observer.

Note that besides silver, copper, molybdenum, aluminum, and alloy, the second electrode 350 may also be implemented with other conductive metals to form embodiments of the present invention. Besides, the structures shown in FIGS. 4-6 may be applied on various types of the resistive touch devices or capacitive touch devices, such as the four-wire, five-wire, six-wire, seven-wire, and eight-wire resistive touch devices, or the matrix-type resistive touch device.

Numbers and arrangements of elements of the touch devices 300 and 400 may be changed to form embodiments of the present invention. For example, a number of the first electrode 330 or the transparent conductive layer 510 utilized in the touch devices 300, 400, or 500 may be multiple, and a plurality of first electrodes 330 may be arranged in dots, in a line, in a quadrangle, or in any shape for utilizing the first electrode 330 or the transparent conductive layer 510 to perform a conducting function.

Figure 7:
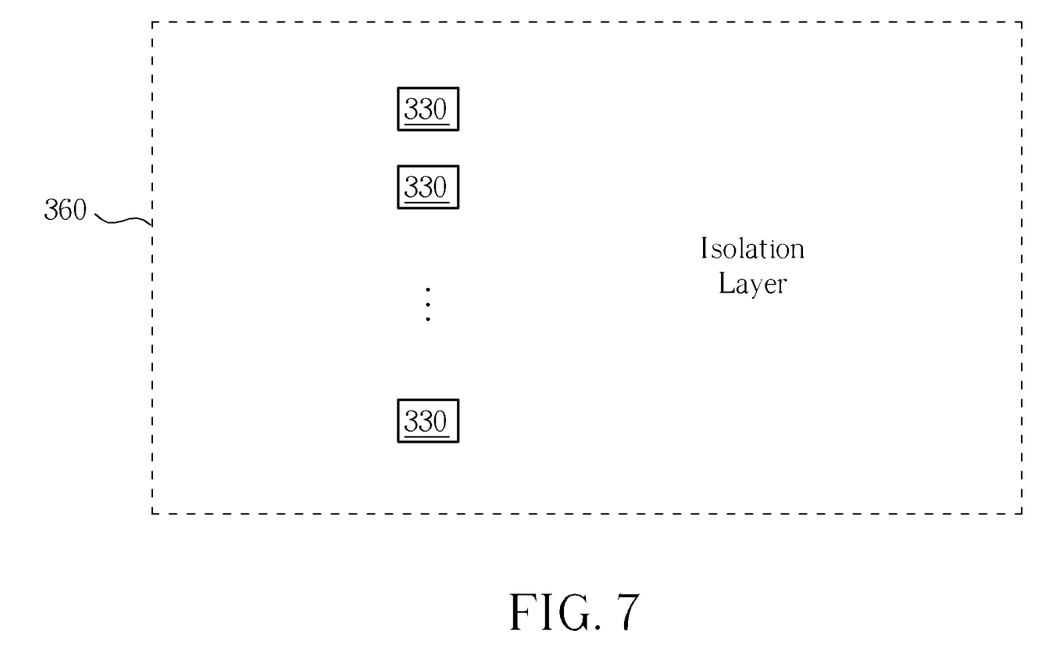
FIG. 7 illustrates a top and transparent view of the touch device shown in FIG. 4.

Please refer to FIG. 7, which illustrates a top and transparent view of the touch device 300 shown in FIG. 4, where the top and transparent view is shown along the section line AMR_R of FIG. 4. As shown in FIG. 7, a plurality of first electrodes 330 is arranged in dots. In another embodiment of the present invention, the plurality of first electrodes 330 shown in FIG. 7 may be tightly connected to each other for forming a line-arranged electrode.

In the above-mentioned embodiments, a hard coat may be disposed on a second side of the conductive film 320, i.e. an opposite side of the first side of the conductive film 320, for implementing a clear surface or an anti-glare surface. Since the process of the disposed hard coat may be applied on any conventional transparent base plate, no further description or diagram will be shown for brevity.

The present invention discloses a plurality of full-planar touch devices. By using a same color for both an electrode and an isolation layer, good visual effects can be achieved for the user of the flat surface touch device of the present invention without using optical adhesives and decoration plates. The conventional front bezel is abandoned in the full-planar touch device of the present invention; therefore, simpler fabrication, higher yield, and lower cost of the touch device are introduced as a result.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A flat surface touch device comprising:
a first base plate which is a transparent base plate;
a transparent conductive film formed directly on a first side of the first base plate;
a first isolation layer formed directly on the first side of the first base plate and a first side of the transparent conductive layer;
a first electrode formed directly on the first side of the transparent conductive film and a first side of the first isolation layer, wherein the first electrode is electrically coupled to the transparent conductive film;
a second electrode formed directly on a first side of the first electrode and the first side of the first isolation area, wherein a color of the second electrode is different from a color of the first electrode;
a second isolation layer formed directly on a first side of the second electrode, the first side of the first electrode, and the first side of the first isolation area, wherein a color of the first isolation layer is the same as the color of the first electrode;
an adhesive layer disposed directly on a first side of the second isolation layer; and
a second base plate disposed directly on a first side of the adhesive layer.

2. The flat surface touch device of claim 1 further comprising:
a hard coat disposed on a second side of the first base plate.

3. The flat surface touch device of claim 2 wherein the hard coat is a clear surface or an anti-glare surface.

4. The flat surface touch device of claim 1 wherein the second electrode is formed on the first side of the first isolation layer and a first side of the first electrode.

5. The flat surface touch device of claim 1 wherein the first base plate is a transparent plastic base plate, and materials of the first base plate include glass, Polyethylene terephthalate (PET), Acrylic, Polymethylmethacrylate (PMMA), or Polycarbonate.

6. The flat surface touch device of claim 1 wherein the transparent conductive film includes Indium tin oxide (ITO), Indium zinc oxide (IZO), Aluminum zinc oxide (AZO), transparent conductive polymer film, or transparent metal film.

7. The flat surface touch device of claim 1 wherein the second electrode is distributed in dots or lines on the flat surface touch device.

8. The flat surface touch device of claim 1 wherein the second electrode is a conductive metal wire made of silver, copper or alloy.

9. The flat surface touch device of claim 1 wherein the second base plate is a conductive glass or a conductive transparent plastic base plate, and materials of the second base plate include glass, Polyethylene terephthalate, Acrylic, Polymethylmethacrylate, or Polycarbonate.

10. A flat surface touch device comprising:
a first base plate which is a transparent base plate;
a transparent conductive film formed directly on a first side of the first base plate;
a first isolation layer formed directly on the first side of the first base plate and directly adjacent the transparent conductive film;
an electrode formed directly on a first side of the first isolation layer;
a transparent conductive layer formed directly on a first side of the transparent conductive film and is directly adjacent the first isolation layer and the electrode, wherein the transparent conductive layer is directly electrically coupled to the electrode;
an adhesive layer disposed directly on a first side of the electrode and the first side of the first isolation layer;
a second isolation layer formed directly on a first side of the adhesive layer; and
a second base plate disposed directly on a first side of the second isolation layer.

11. The flat surface touch device of claim 10 further comprising:
a hard coat disposed on a second side of the first base plate.

12. The flat surface touch device of claim 11 wherein the hard coat is a clear surface or an anti-glare surface.

13. The flat surface touch device of claim 10 wherein the electrode is distributed by dots or lines on the flat surface touch device.

14. The flat surface touch device of claims 10 wherein the first base plate is a transparent plastic base plate, and materials of the first base plate include glass, Polyethylene terephthalate (PET), Acrylic, Polymethylmethacrylate (PMMA), or Polycarbonate.

15. The flat surface touch device of claim 10 wherein the transparent conductive film includes Indium tin oxide (ITO), Indium zinc oxide (IZO), Aluminum zinc oxide (AZO), transparent conductive polymer film, or transparent metal film.

16. The flat surface touch device of claim 10 wherein the second electrode is a conductive metal wire made of silver, copper or alloy.

17. The flat surface touch device of claim 10 wherein the second base plate is a conductive glass or a conductive transparent plastic base plate, and materials of the second base plate include glass, Polyethylene terephthalate, Acrylic, Polymethylmethacrylate, or Polycarbonate.

* * * * *